US009537459B2

(12) United States Patent
Hayes, Jr.

(10) Patent No.: US 9,537,459 B2
(45) Date of Patent: *Jan. 3, 2017

(54) AUDIO SYSTEM WITH PARENTAL MAXIMUM VOLUME CONTROL

(71) Applicant: Panasonic Automotive Systems Company of America, division of Panasonic Corporation of North America, Peachtree City, GA (US)

(72) Inventor: Kenneth Edward Hayes, Jr., Sharpsburg, GA (US)

(73) Assignee: Panasonic Automotive Systems Company of America, division of Panasonic Corporation of North America, Peachtree City, GA (US)

( * ) Notice: Subject to any disclaimer, the term of this patent is extended or adjusted under 35 U.S.C. 154(b) by 799 days.

This patent is subject to a terminal disclaimer.

(21) Appl. No.: 13/729,834

(22) Filed: Dec. 28, 2012

(65) Prior Publication Data
US 2013/0114828 A1 May 9, 2013

Related U.S. Application Data

(63) Continuation of application No. 11/388,496, filed on Mar. 24, 2006, now Pat. No. 8,369,539.

(51) Int. Cl.
*H03G 3/00* (2006.01)
*H03G 3/02* (2006.01)
*H03G 11/00* (2006.01)

(52) U.S. Cl.
CPC ............... *H03G 3/02* (2013.01); *H03G 11/00* (2013.01)

(58) Field of Classification Search
CPC .......... H03G 3/20; H03G 5/005; H03G 5/165; G06F 3/165; H04R 2430/01; G10L 21/0316
USPC ................................ 381/104, 107, 109, 302
See application file for complete search history.

(56) References Cited

U.S. PATENT DOCUMENTS

| 5,491,755 | A | * | 2/1996 | Vogt et al. ..................... 381/86 |
| 6,330,337 | B1 | * | 12/2001 | Nicholson .............. H04B 1/207 381/302 |
| 6,526,335 | B1 | * | 2/2003 | Treyz ..................... G01C 21/26 307/10.1 |
| 8,369,539 | B2 | * | 2/2013 | Hayes, Jr. .............. H03G 11/00 381/104 |

(Continued)

FOREIGN PATENT DOCUMENTS

AE  GB 2271030 A * 3/1994 ............... H03G 3/10

Primary Examiner — Alexander Jamal
(74) Attorney, Agent, or Firm — Laurence S. Roach, Esq.

(57) ABSTRACT

A user interface (104) of an audio system (100) enables adjustment of a volume level of an audio signal being reproduced on at least a portion of the audio system to a desired maximum volume level. The user interface further enables the desired maximum volume level to be selected as a set maximum volume level. A processor (102) electrically interconnected with the user interface limits the volume at which audio programs are reproduced on at least a portion of the audio system to said set maximum volume level. An audio signal is generated, a volume level of the audio signal is adjusted to a desired maximum volume level in response to a user input, and the desired maximum volume level is established as a set maximum volume level for audio programs played on at least a portion of the audio system (100).

22 Claims, 4 Drawing Sheets

(56) References Cited

U.S. PATENT DOCUMENTS

| | | | |
|---|---|---|---|
| 2004/0175002 A1* | 9/2004 | Christensen | H04R 29/007 381/59 |
| 2005/0078838 A1* | 4/2005 | Simon | A61B 5/121 381/98 |
| 2005/0195994 A1* | 9/2005 | Saito et al. | 381/102 |
| 2008/0273722 A1* | 11/2008 | Aylward | H04R 5/02 381/302 |
| 2013/0114828 A1* | 5/2013 | Hayes, Jr. | H03G 3/02 381/86 |

* cited by examiner

AUDIO SYSTEM WITH PARENTAL MAXIMUM VOLUME CONTROL

CROSS-REFERENCE TO RELATED APPLICATION

This application is a continuation of U.S. patent application Ser. No. 11/388,496, filed on Mar. 24, 2006, now U.S. Pat. No. 8,369,539, issued on Feb. 5, 2013, the disclosure of which is hereby incorporated by reference in its entirety for all purposes.

FIELD OF THE INVENTION

The present invention generally relates to audio systems. In particular, the present invention relates to a system and method for setting a maximum volume level for headphones that are used in a confined space, such as a vehicle interior.

BACKGROUND OF THE INVENTION

Many conventional vehicle audio systems allow occupants of one or more rear seats to listen to audio programs, such as music or the audio portion of a movie, via headphones. Such systems typically also give the listener the ability to adjust the volume of the audio signal being reproduced by the headphones. Because a vehicle is a rather confined space, other occupants of the vehicle may be annoyed if a rear seat occupant, such as a child, is listening to an audio program at an elevated volume level. Additionally, audio systems may permit volume levels sufficiently loud to cause discomfort to a user. An audio system and associated method that facilitates listening in a confined space without annoying others in addition to contributing to improved user comfort is therefore desirable.

SUMMARY OF THE INVENTION

The disclosed embodiments relate to an audio system, as well as an associated method. An exemplary embodiment of the system comprises a user interface that is adapted to allow adjustment of a volume level, and a processor that is adapted to allow a maximum volume level to be set for audio programs played on at least a portion of the audio system, such as one or more headphones. When the maximum volume level has been set, subsequent attempts to raise the volume level at which audio programming is played to a level above the set maximum volume level will be ignored by the system. An exemplary method comprises generating an audio signal, adjusting a volume level of the audio signal in response to a user input to a desired maximum volume level, and setting a maximum volume level for an audio program played on at least a portion of the audio system based on the desired maximum volume level of the audio signal. Subsequent attempts by a listener of the system to exceed the set maximum volume level are ignored.

BRIEF DESCRIPTION OF THE DRAWINGS

The above-mentioned and other features and advantages of the present invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate a preferred embodiment of the invention, in one form, and such exemplifications are not to be construed as limiting in any manner the scope of the invention.

DETAILED DESCRIPTION OF THE PREFERRED EMBODIMENT

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Exemplary embodiments of the present invention allow a parent or other authorized user of an audio system, such as a vehicle audio system, to set a maximum volume level for the playing of audio programs. For example, an authorized user may set the maximum volume level for wired or wireless rear seat headphones. The maximum volume level may be set or established at a level that minimizes or reduces annoyance to other vehicle occupants. Specifically, the maximum volume level may be set or established so as to reduce the likelihood of discomfort or surprise to a subsequent listener. Also, the maximum volume level may be set or established so as to eliminate or reduce unpleasant surprise and discomfort experienced when subsequent listeners put on the headphones without realizing they were previously set to play programs at a louder volume level than they desire.

Figure 1:
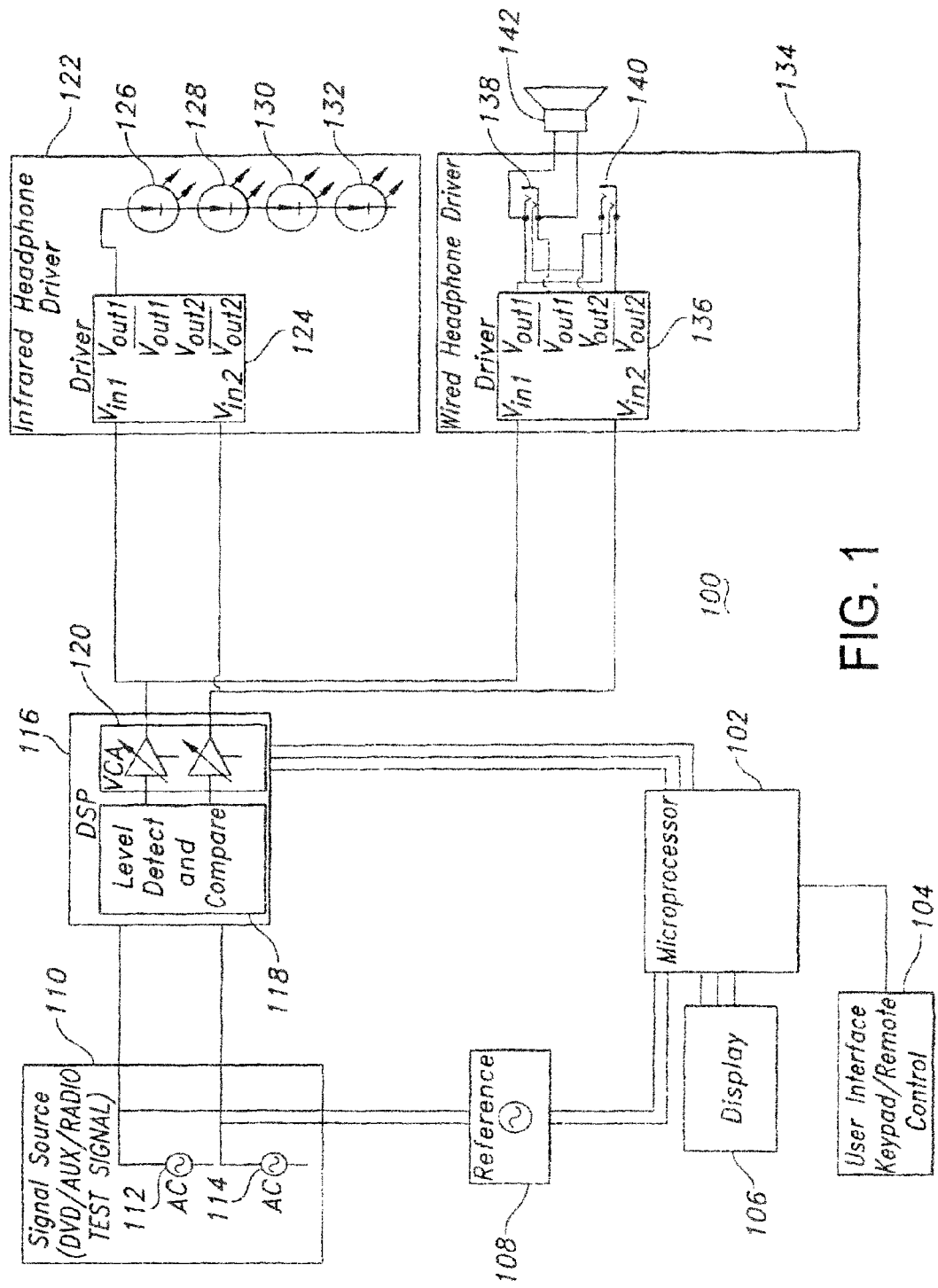
FIG. 1 is a block diagram of an audio system in accordance with an exemplary embodiment of the present invention.

FIG. 1 is a block diagram of an audio system in accordance with an exemplary embodiment of the present invention. The system is generally referred to by the reference number 100. The audio system 100 is controlled by a microprocessor 102, which may be programmed to provide a wide variety of system functions. A user interface 104 is connected to the microprocessor 102 to allow the entry of control information by a user of the system. The user interface may comprise a keypad, a remote control or the like.

In an exemplary embodiment of the present invention, the user interface 104 comprises a rear seat audio control mounted in the general vicinity of the rear seat of the vehicle or within reach of rear seat occupants. Such a rear seat audio control may be used, for example, to select a desired audio or video program and to adjust the volume of the audio program being reproduced in headphones worn by a rear seat occupant. Alternatively, the user interface 104 may comprise a portion of a front seat control or "head" unit accessible to a front seat occupant of the vehicle. In addition, those of ordinary skill in the art will appreciate that exemplary embodiments of the present invention may be employed in connection with other audio and video systems as well, such as, for example, those not in vehicles. As set forth below, the user interface 104 is used to set a maximum volume level in accordance with an exemplary embodiment of the present invention. When a maximum volume level is set, subsequent attempts to exceed the set maximum volume level when playing audio programs will be ignored.

A display 106 is connected to the microprocessor 102. The display 106 may be adapted to provide a visual representation of various control functions of the audio system 100. For example, the display 106 may be used to provide a visual indication of a set maximum volume level that is programmable by a user of the system. Examples of implementations of the display 106 in exemplary embodiments of the present invention include use of the display 106 as a control panel disposed for access by either a front or rear seat occupant of a vehicle or the like. Additionally, the display 106 may also serve as the primary display screen of a video device such as a television or DVD player.

The reference generator 108 is connected to a signal source 110, which is adapted to provide a variety of programming options to users of the audio system 100. For example, the signal source 110 may be adapted to allow a user to select a program input from a variety of program input choices. Examples of program inputs in a typical system include input from a DVD player, a CD player, an auxiliary input such as a video game, AM radio, FM radio or the like. Programming may be provided by the signal source 110 via a plurality of program inputs 112, 114. In an exemplary embodiment of the present invention, the user interface 104 is adapted to allow the selection of a program to be played by the signal source 110.

A reference generator 108 is connected to the microprocessor 102 and the signal source 110. In an exemplary embodiment of the present invention, the reference generator 108 produces a test tone of predetermined frequency or combination of frequencies that is used to set the maximum volume level for the system as further described below. In an alternative embodiment, the reference generator 108 is omitted from the system and the user employs an audio program selected via the signal source 110 to set the maximum volume level. A user of the system adjusts the volume level to a desired maximum volume level and then establishes or sets the maximum volume level at which audio programming may be played. When the maximum volume level is set for the system, the volume of audio programs may be subsequently adjusted up to but not in excess of the set maximum volume level.

The output of the signal source 110 is delivered to a digital signal processor (DSP) 116. The DSP 116 comprises a level detect and compare circuit 118 and a voltage controlled amplifier circuit 120, which is identified as "VCA" in FIG. 1.

Output from the DSP 16 is delivered to an infrared headphone driver 122 and a wired headphone driver 134. The infrared headphone driver 122 comprises a driver circuit 124, which delivers output to a plurality of infrared transmitters 126, 128, 130 and 132. The infrared transmitters 126, 128, 130 and 132 are adapted to deliver an audio signal to a corresponding wireless set of headphones (not shown).

The wired headphone driver 134 comprises a driver circuit 136, which delivers a signal to a plurality of headphone jacks 138, 140. A set of headphones, represented as a speaker 142 in FIG. 1, is connected to the headphone jack 138. In an exemplary embodiment of the present invention, the headphones 142 comprise multiple speakers.

As set forth above, a listener may listen to an audio program provided by the signal source 110 via the headphones 142. In addition, a user may listen to a reference audio signal generated by the reference generator 108 through the headphones 142. The user then adjusts the volume level to a desired maximum volume level and sets or establishes the desired maximum volume level as the set maximum volume level for a portion of the audio system via the user interface 104. The system will ignore subsequent attempts to adjust the volume of the headphones to a volume level that is higher than the set maximum volume level established by the authorized user.

In an exemplary embodiment of the present invention, setting or establishing the maximum volume level requires entry of a predetermined authorization code. For example, setting or establishing the maximum volume level is accomplished by inputting a predetermined authorization code via user interface 104. In this manner, the set maximum volume level is enforced on users of the system not in possession of the authorization code. For example, a parent may enforce the set maximum volume level on children who listen to audio programs on the system. The process of setting or establishing the maximum volume level using a menu control system in conjunction with video feedback via the display 106 is described below with reference to FIGS. 2-4.

Figure 2:
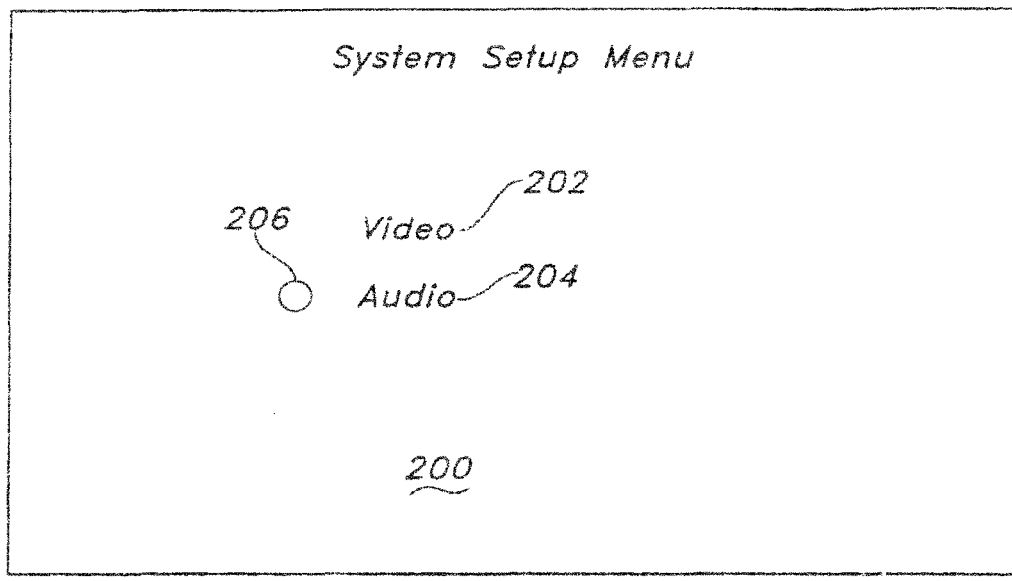
FIG. 2 is a block diagram of a system setup menu in accordance with an exemplary embodiment of the present invention.

FIG. 2 is a block diagram of a system setup menu in accordance with an exemplary embodiment of the present invention. The system setup menu is generally referred to by the reference number 200. In an exemplary embodiment of the present invention, the system setup menu 200 is displayed on the display 106 (FIG. 1) upon entry of a command by the user. The system setup menu 200 includes a video icon 202, which allows the user to choose submenus to control functionality related to a video display. An audio icon 204 allows the user to access submenus to control functionality related to an audio system. A selection indicator 206 is movable between the video icon 202 and the audio icon 204. Upon selecting the audio icon 204, the user is provided with a list of submenus relating to audio functionality of the system.

Figure 3:
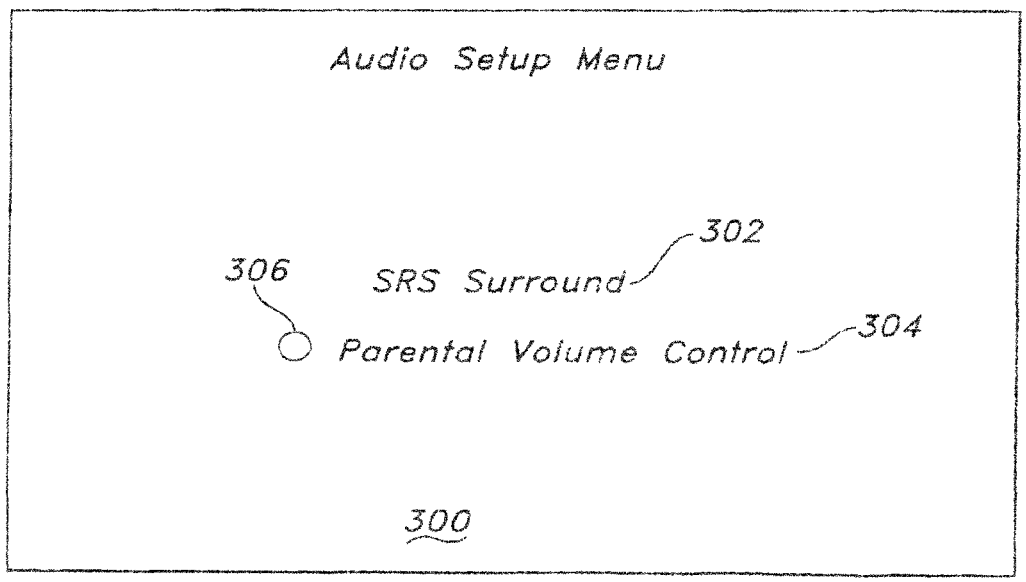
FIG. 3 is a block diagram of an audio setup menu in accordance with an exemplary embodiment of the present invention.

FIG. 3 is a block diagram of an audio setup menu in accordance with an exemplary embodiment of the present invention. The audio setup menu is generally identified by the reference number 300. The audio setup menu 300 includes a variety of choices relating to system audio functionality. In the exemplary embodiment shown in FIG. 3, an SRS surround icon 302 allows the user to select further submenus relative to surround sound parameters of the system. A parental volume control icon 304 is used to allow the user to set the maximum volume level of the system in accordance with an exemplary embodiment of the present invention. The user may position a selection indicator 306 adjacent to the parental volume control icon 304 and select that icon to initiate the the process of setting or establishing the maximum volume.

Figure 4:
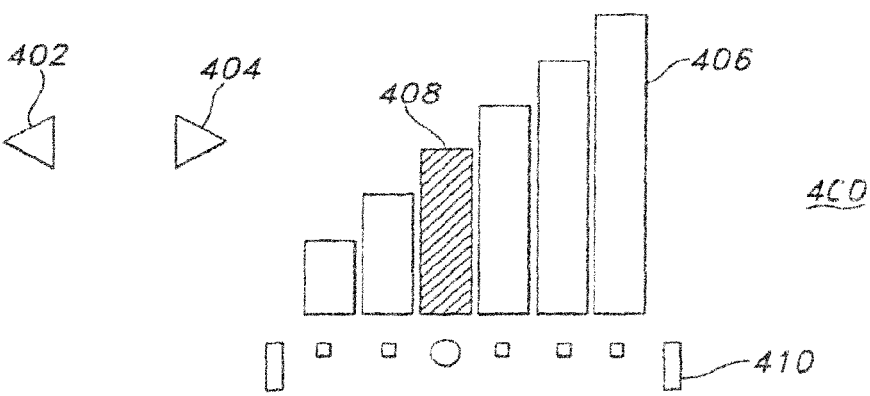
FIG. 4 is a diagram of a display screen in accordance with an exemplary embodiment of the present invention.

FIG. 4 is a diagram of a display screen in accordance with an exemplary embodiment of the present invention. The parental volume control screen is generally referred to by the reference number 400. In an exemplary embodiment of the present invention, the set maximum volume level applies to listeners using headphones connected to an access point such as a headphone jack 138 (FIG. 1) or one or more wireless or infrared headphones for use in the rear of the vehicle. Alternatively, the set maximum volume setting may be enforced on other speakers such as front speakers in a vehicle, or on all speakers associated with the system.

In operation, the parental volume control screen 400 prompts the user to initiate a test audio signal generated by the reference generator 108 (FIG. 1). The user adjusts the volume of the test audio signal in the headphones 142 (FIG. 1) via the user interface 104 (FIG. 1) to a desired maximum volume level. As set forth above, the user interface may be disposed for access in the rear of the vehicle. Alternatively, the user interface 104 may comprise touch screen controls on a display accessible from the front seat of the vehicle. The touch screen controls may include a "reduce volume" control 402 and/or an "increase volume" control 404.

A visual indication of the volume level is given via the display of a plurality of loudness bars 406. The current volume level is indicated by coloring or shading of a particular volume bar, as represented by the volume bar 408 in FIG. 4. Additionally, a volume scale 410 is employed to give a visual indication of the relative current volume of the test audio signal. When the maximum desired volume is reached, the user selects or sets that volume level as the maximum allowable volume level for subsequent audio programming. For example, the user presses the enter key when the desired maximum volume level is obtained to thereby establish or set that volume level as the set maximum volume level. In an exemplary embodiment of the present invention, the maximum volume level may only be set or established by a user who enters a predetermined authorization code such as a parental lock code. Once set, the maximum volume level is enforced through at least a portion of the audio system until reset by a user with the proper authorization code. An exemplary embodiment of the present invention provides a default maximum volume level, such as, for example, in the midrange of the capabilities of the audio system 100 (FIG. 1).

Figure 5:
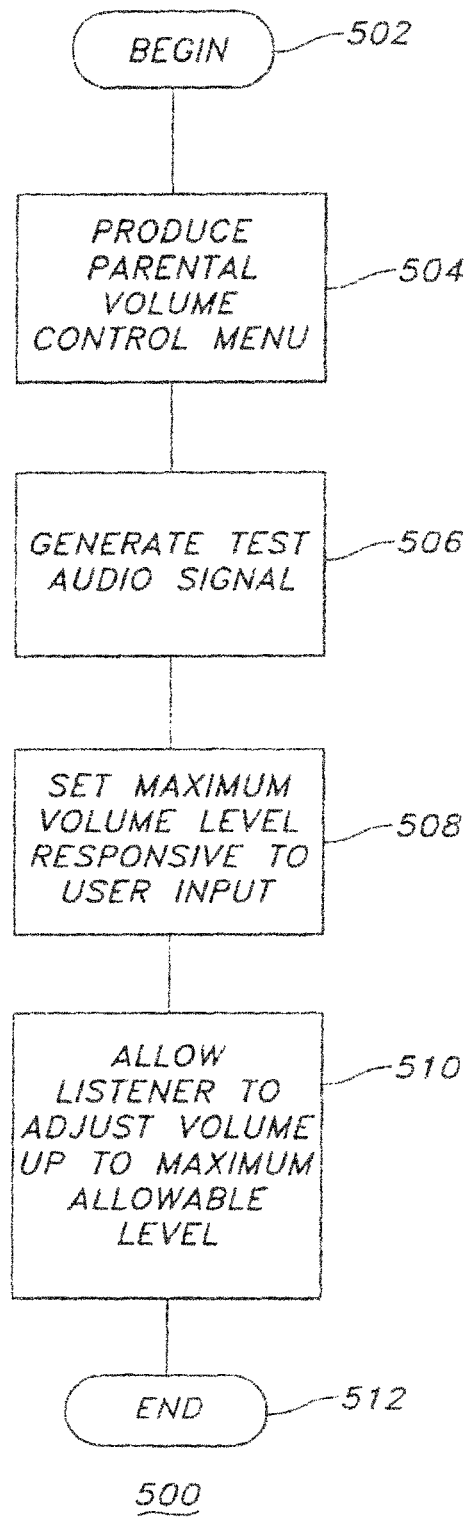
FIG. 5 is a flow diagram of a process in accordance with an exemplary embodiment of the present invention.

FIG. 5 is a flow diagram of a process in accordance with an exemplary embodiment of the present invention. The diagram is generally referred to by the reference number 500. At block 502, the process begins. At block 504, a parental volume control menu is produced by a system such as the system 100 (FIG. 1). In response to a user input, a test audio signal is generated, as shown at block 506, through one or more predetermined or user-selected speakers or headphones. As set forth above, the test audio signal may be a typical audio program of which the system is capable of playing or an application-specific audio program, such as a test tone generated by the reference generator 108 (FIG. 1).

At block 508, a maximum volume level is set within the system responsive to a user input. In an exemplary embodiment of the present invention, the user is prompted for entry of an authorization code in order to set or establish the maximum volume level. In this manner, the set maximum volume level is able to be set or established only by an authorized user and is enforced on all other users of the system not having access to the authorization code. After the maximum volume level is established, subsequent attempts to exceed that level are ignored by the system for one or more speakers, zones of speakers, or headphones associated with the system, as shown at block 510. It will be understood by those of ordinary skill in the art that the speakers, zones of speakers, or headphones to which the set maximum volume level shall be applied are selectable by a user. At block 512, the process ends.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

The invention claimed is:

1. An audio system for a vehicle having a plurality of speakers, the speakers including front speakers and other speakers, the system comprising:
   a user interface that enables adjustment of a volume level of an audio signal being reproduced on at least a portion of the audio system to a desired maximum volume level, said interface further enabling said desired maximum volume level to be established as a set maximum volume level;
   an audio signal generator that generates the audio signal corresponding to the volume level during the adjustment of the volume level to the desired maximum volume level; and
   a processor electrically interconnected with said user interface and adapted to limit the volume level at which audio programs are reproduced on the front speakers to said set maximum volume level, the processor being adapted to limit the volume level on the front speakers but not on all of the speakers.

2. The audio system recited in claim 1, wherein the processor is adapted to allow said set maximum volume level to be established only upon receipt of a predetermined code entered by a user into the user interface.

3. The audio system recited in claim 1, wherein the user interface comprises a keypad disposed in a rear seat of a vehicle.

4. The audio system recited in claim 1, comprising a display that is adapted to provide a visual indication of at least one of the set maximum volume level and the current volume level.

5. The audio system recited in claim 1, wherein the audio signal generator comprises a reference generator that is adapted to produce the audio signal.

6. The audio system recited in claim 5, wherein the audio signal comprises an audio tone.

7. The audio system recited in claim 1, wherein the audio signal comprises an audio program.

8. An audio system for a vehicle having a plurality of speakers, the system comprising:
   a user interface that enables adjustment of a volume level of an audio signal being reproduced on at least a portion of the audio system to a desired maximum volume level, said interface further enabling said desired maximum volume level to be established as a set maximum volume level;
   an audio signal generator that generates the audio signal corresponding to the volume level during the adjustment of the volume level to the desired maximum volume level; and
   a processor electrically interconnected with said user interface and adapted to limit the volume level at which audio programs are reproduced on selected ones of the speakers to said set maximum volume level, the processor being adapted to limit the volume level on the selected speakers but not on all of the speakers, the selected speakers that are adapted to play audio programs subject to the maximum volume level being selectable by a user.

9. The audio system recited in claim 8, wherein the selected speakers comprise a set of headphones.

10. The audio system recited in claim 9, wherein the set of headphones is adapted to connect to the audio system via a wired communication link.

11. The audio system recited in claim 9, wherein the set of headphones is adapted to connect to the audio system via a wireless communication link.

12. The audio system recited in claim 11, wherein the wireless communication link comprises an infrared communication link.

13. A method of operating an audio system including a plurality of zones of speakers, the method comprising:
   generating an audio signal;
   adjusting in response to user input a volume level of the audio signal to a desired maximum volume level;
   receiving a selection from a user of one of the zones of speakers to which the desired maximum volume is to be applied; and
   establishing the desired maximum volume level as a first maximum volume level for an audio program played on the selected zone of speakers of the audio system without establishing a second maximum volume level for the audio program played on any other zone of the zones of speakers of the audio system.

14. The method recited in claim 13, wherein said first maximum volume level is established only in response to the entry of a predetermined authorization code.

15. The method recited in claim 13, comprising limiting the volume level of the audio program played on the selected zone of speakers of the audio system to a level that is equal to or less than said first maximum volume level.

16. The method recited in claim 13, comprising playing the audio program over a speaker via a wired communication link.

17. The method recited in claim 13, comprising playing the audio program over a speaker via a wireless infrared communication link.

18. The method recited in claim 13, wherein the user input is received via a user interface that comprises a keypad disposed in a rear seat of a vehicle.

19. The method recited in claim 13, comprising displaying a visual indication of said first maximum volume level.

20. The method recited in claim 13, wherein the audio signal comprises an audio tone.

21. The method recited in claim 13, wherein the audio signal comprises an audio program.

22. The method recited in claim 13, further comprising establishing, before the establishing of the desired maximum volume level, a default maximum volume level as a set maximum volume level for audio programs played on at least one of the zones of speakers of the audio system, the default maximum volume level being in a midrange of capabilities of the audio system.

* * * * *